United States Patent
Chito

(10) Patent No.: US 10,453,719 B2
(45) Date of Patent: Oct. 22, 2019

(54) PLASMA ETCHING METHOD

(71) Applicant: DISCO CORPORATION, Tokyo (JP)

(72) Inventor: Kenta Chito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/897,386

(22) Filed: Feb. 15, 2018

(65) Prior Publication Data

US 2018/0240690 A1    Aug. 23, 2018

(30) Foreign Application Priority Data

Feb. 17, 2017 (JP) ................................. 2017-027477

(51) Int. Cl.
*H01L 21/67* (2006.01)
*H01J 37/32* (2006.01)
*H01L 21/683* (2006.01)
*H01L 21/304* (2006.01)
*H01L 21/3065* (2006.01)

(52) U.S. Cl.
CPC .. *H01L 21/67132* (2013.01); *H01J 37/32458* (2013.01); *H01J 37/32715* (2013.01); *H01L 21/304* (2013.01); *H01L 21/3065* (2013.01); *H01L 21/67103* (2013.01); *H01L 21/6831* (2013.01); *H01L 21/6836* (2013.01); *H01L 21/6838* (2013.01); *H01J 2237/1825* (2013.01); *H01J 2237/334* (2013.01); *H01L 2221/68327* (2013.01); *H01L 2221/68381* (2013.01)

(58) Field of Classification Search
None
See application file for complete search history.

(56) References Cited

U.S. PATENT DOCUMENTS

| | | | |
|---|---|---|---|
| 10,175,588 B2* | 1/2019 | Iida | H01L 21/3065 |
| 2002/0197877 A1* | 12/2002 | Arita | H01J 37/3244 |
| | | | 438/710 |
| 2005/0115671 A1* | 6/2005 | Araki | B08B 7/04 |
| | | | 156/345.12 |
| 2012/0070658 A1* | 3/2012 | Ikishima | H01L 21/6836 |
| | | | 428/354 |
| 2017/0018429 A1* | 1/2017 | Kitabayashi | H01L 21/0485 |

FOREIGN PATENT DOCUMENTS

JP        2016143785 A        8/2016

* cited by examiner

*Primary Examiner* — Shamim Ahmed
(74) *Attorney, Agent, or Firm* — Greer Burns & Crain, Ltd.

(57) ABSTRACT

Disclosed herein is a plasma etching method for plasma-etching a ground surface of a wafer after the wafer with a tape attached to its lower surface is ground. The plasma etching method includes a drying step of applying heat to the tape to remove water present in the tape, an electrostatic holding step of electrostatically holding the wafer by an electrostatic force generated by supplying DC power to electrodes of an electrostatic chuck, after the drying step, and an etching step of reducing the pressure of a reduced-pressure chamber and plasma-etching the ground surface of the wafer by a reaction gas brought into a plasma state, after the electrostatic holding step.

4 Claims, 2 Drawing Sheets

PLASMA ETCHING METHOD

BACKGROUND OF THE INVENTION

Field of the Invention

The present invention relates to a plasma etching method.

Description of the Related Art

After grinding of a wafer by a grinding apparatus, grinding streaks are left on the ground surface of the wafer, and the grinding streaks cause a lowering in the die strength of the wafer. In view of this problem, an apparatus has been proposed for removing grinding streaks from a ground surface of a wafer by plasma etching (see, for example, Japanese Patent Laid-Open No. 2016-143785). In the plasma etching apparatus, the wafer is carried into a reduced-pressure chamber (chamber) from the exterior through an opening and shutting door, and, in a state in which the pressure inside the reduced-pressure chamber is reduced, an etching gas is supplied into the reduced-pressure chamber. Then, the etching gas brought into a plasma state is put into reaction with the wafer to remove the grinding streaks from the ground surface, whereby a lowering in the die strength due to the grinding streaks on the ground wafer is restrained.

SUMMARY OF THE INVENTION

In grinding by a grinding apparatus, grinding water is supplied to the wafer and a grinding wheel, to remove heat generated due to the grinding. Particularly, the wafer having been ground is wet, and, therefore, the ground wafer must be preliminarily dried before fed into the reduced-pressure chamber. In view of this, it may be contemplated to blow dry air to the wafer and a tape thereon to preliminarily remove water from the surfaces thereof. However, although the surfaces of the wafer and the tape are dried by blowing of dry air thereto, the inside is dried insufficiently. Therefore, there have been cases in which water present in the inside is evaporated upon a reduction in pressure, to form a bubble (gap) between the tape and an electrostatic chuck. The electrostatic chuck is formed therein with a cooling water passage for passing therethrough cooling water for removing reaction heat generated upon the reaction between the etching gas and the wafer. If plasma etching is conducted in a state in which the bubble is formed, the electrostatic chuck and the tape are out of contact due to the bubble, so that the tape in the area of the bubble is not cooled but is exposed to a high temperature due to the reaction heat. As a result, the adhesive of the tape is melted, and the adhesive is adheres to a device upon peeling of the tape from the wafer. In addition, when exposed to a higher temperature, a phenomenon called "tape burn" in which the tape is melted with the result of formation of a hole may be generated.

It is therefore an object of the present invention to provide a plasma etching method by which tape burn can be prevented from occurring.

In accordance with an aspect of the present invention, there is provided a plasma etching method for plasma-etching a ground surface of a wafer by a plasma etching apparatus after the wafer with a tape attached to its surface on one side is subjected to grinding of its surface on an other side by a grinding wheel while supplying grinding water, the plasma etching apparatus including an electrostatic chuck for holding the wafer through the tape by an electrostatic force generated by supplying direct current power to electrodes disposed inside, and a reduced-pressure chamber which accommodates the electrostatic chuck holding the wafer, the pressure inside which is reduced, in which a reaction gas is brought into a plasma state, and in which plasma etching of the wafer is conducted. The plasma etching method includes a drying step of applying heat to the tape to remove water present in the tape, an electrostatic holding step of supplying direct current power to the electrodes of the electrostatic chuck to generate static electricity and to thereby electrostatically hold the wafer, after the drying step, and an etching step of reducing the pressure in the reduced-pressure chamber, and plasma-etching the ground surface of the wafer held by the electrostatic chuck by the reaction gas brought into the plasma state, after the electrostatic holding step.

According to this configuration, even when grinding water is absorbed in the tape due to the grinding, positive heating of the taper makes it possible to remove the water present in the tape. Therefore, even upon a reduction in the pressure inside the reduced-pressure chamber at the time of the etching step, no water comes out of the tape, so that generation of a bubble between the tape and a holding surface of the electrostatic chuck can be prevented. Accordingly, tape burn can be prevented from occurring due to plasma etching.

According to the present invention, generation of a bubble between the tape and the holding surface of the electrostatic chuck can be prevented, and tape burn can be prevented from occurring.

The above and other objects, features and advantages of the present invention and the manner of realizing them will become more apparent, and the invention itself will best be understood from a study of the following description and appended claim with reference to the attached drawings showing a preferred embodiment of the invention.

DETAILED DESCRIPTION OF THE PREFERRED EMBODIMENT

In a plasma etching apparatus, a wafer having been ground is attracted and held by an electrostatic chuck disposed in a reduced-pressure chamber. The interior of the reduced-pressure chamber is reduced in pressure, after which a reaction gas (etching gas) is supplied. Then, high-frequency electric power is supplied to the reaction gas to bring the reaction gas into a plasma state, and the wafer is plasma etched by the reaction gas brought into the plasma state.

In such a plasma etching apparatus, it is necessary to reduce the pressure inside the reduced-pressure chamber as above-mentioned. Since pressure reduction time for the reduced-pressure chamber depends on the humidity in the reduced-pressure chamber, it is not so preferable to carry a wet wafer having been processed (for example, having been ground) into the reduced-pressure chamber. Therefore, it may be contemplated to preliminarily dry the surface of the processed wafer by, for example, blowing dry air thereto.

Figure 1A:
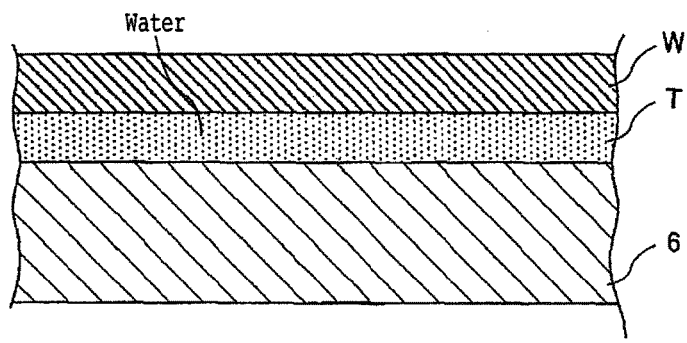
FIGS. 1A to 1C are partial enlarged sectional views illustrating a case where a wafer is held by a method according to the prior art.
Figure 1B:
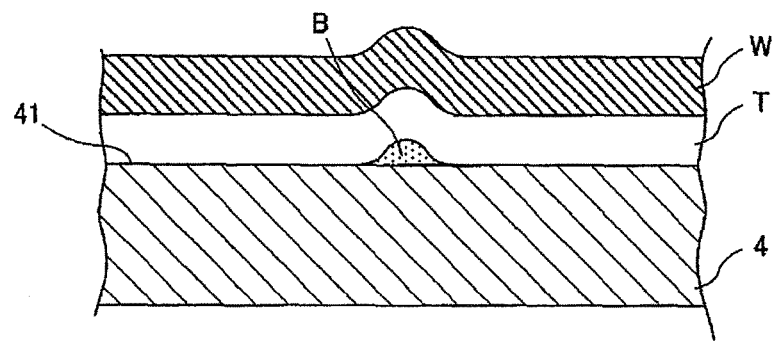
Figure 1C:
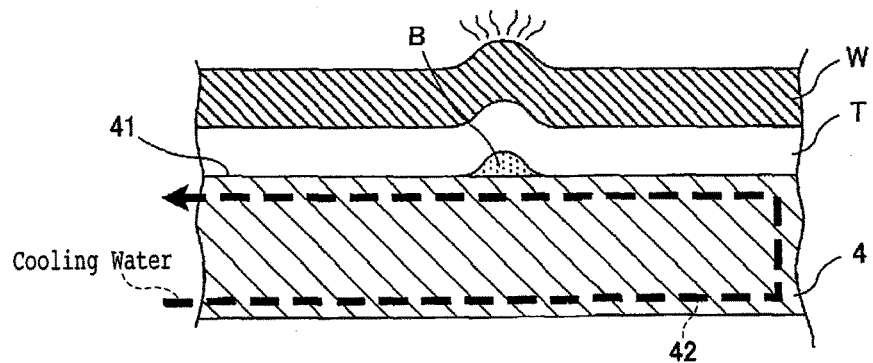

FIGS. 1A to 1C are partial enlarged sectional views illustrating a case where a wafer is held by a method according to the prior art. FIG. 1A depicts the wafer in a state immediately after grinding thereof, FIG. 1B depicts the wafer in a state in which the pressure in the reduced-pressure chamber is reduced, and FIG. 1C depicts the wafer in a state during etching thereof. As depicted in FIGS. 1A to 1C, a tape T as a protective member is attached to a lower surface of the wafer W. The tape T has an adhesive material applied to a surface of a base material, and the adhesive material side is the attaching surface (adhesive surface) of the tape T. The base material is formed from a synthetic resin such as polyurethane, polyethylene terephthalate (PET), or polyolefin, and is water-absorbing (hygroscopic), though only slightly.

During grinding, the wafer W is attracted and held by a holding table 6 of a grinding apparatus through the tape T, as depicted in FIG. 1A, so that the base material side is not exposed directly to the outside. However, processing water such as grinding water is absorbed into the base material through an outer peripheral portion. Even if air is blown to the surface of the wafer W when the wafer W is carried into the reduced-pressure chamber, therefore, water absorbed in the tape (base material) cannot be removed. As a result, a reduction of the pressure inside the reduced-pressure chamber would cause water to come out of the inside of the base material and to be evaporated, possibly forming a bubble B between the tape T and a holding surface 41 of an electrostatic chuck 4, as illustrated in FIG. 1B.

When plasma etching is conducted in a state in which the bubble B is left between the tape T and the holding surface 41, the periphery of the bubble B is warmed by the heat of etching in a state in which a part of the work (the wafer W and the tape T) is floated from the holding surface 41.

Particularly during etching, cooling water is flowing in a water jacket (not depicted) formed in the inside of the electrostatic chuck 4, as depicted in FIG. 1C, whereby an abnormal rise in temperature of the electrostatic chuck 4 and the wafer W is restrained from occurring. However, since the lower surface of the tape T at the part where the bubble B has been generated as above-mentioned is not in contact with the holding surface 41, the tape T is not properly cooled there. As a result, a phenomenon called "tape burn" in which the tape T in the vicinity of the bubble B is exposed to high temperature and is burned, resulting in formation of a hole, may be generated.

In view of this problem, paying attention to the material of the tape (base material), the present inventor has found out that the phenomenon in which a reduction in the pressure inside the reduced-pressure chamber causes water in the tape T to come out of the tape T and to be evaporated, resulting in the formation of the bubble B between the tape T and the electrostatic chuck 4, arises from the difference in water-absorbing property depending on the kind of the tape T. In other words, the gist of the present invention resides in positively heating the tape T to remove water present in the tape T prior to etching, taking into account the fact that water used during grinding is absorbed in the tape T.

Figure 2:
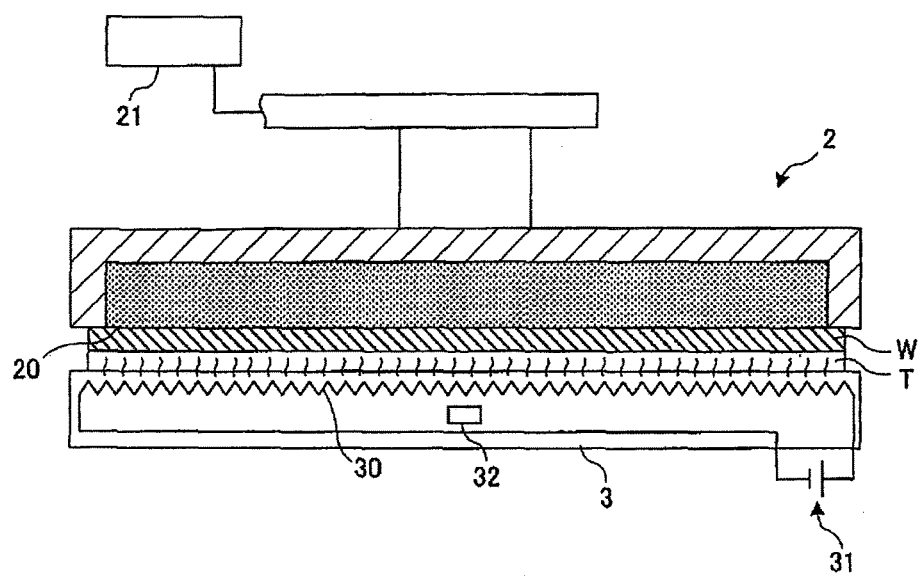
FIG. 2 is a schematic sectional view depicting an example of a drying step according to the present embodiment.

Specifically, in the present embodiment, prior to holding the wafer W by the electrostatic chuck 4, the wafer W is preliminarily placed on a heater table 3, and heat is applied from the heater table 3 to the tape T, thereby removing water present in the tape T (see FIG. 2). As a result, the tape T is preliminarily dried, so that even when the pressure inside a reduced-pressure chamber C is reduced after the wafer W is carried onto the electrostatic chuck 4, no water comes out of the tape T, and, therefore, formation of a bubble between the tape T and the electrostatic chuck 4 does not occur. For this reason, generation of tape burn can be prevented, even when plasma etching is carried out.

Figure 3:
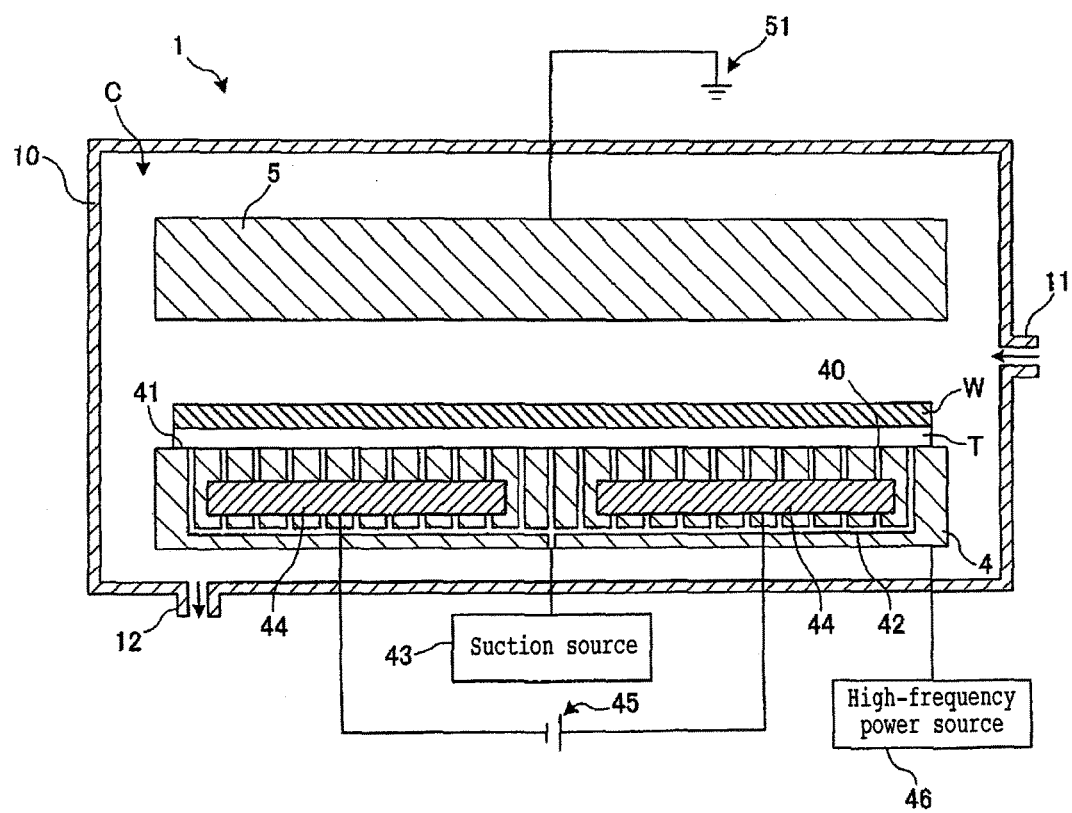
FIG. 3 is a schematic sectional view depicting an example of an electrostatic holding step and an etching step according to the present embodiment.

A plasma etching method according to the present embodiment will be described below, referring to the attached drawings. FIG. 2 is a schematic sectional view depicting an example of a drying step according to the present embodiment. FIG. 3 is a schematic sectional view depicting an example of an electrostatic holding step and an etching step according to the present embodiment. While a plasma etching apparatus 1 of a capacitively coupled plasma (CCP) type is taken as an example of a reduced-pressure treatment apparatus in describing the present embodiment, the reduced-pressure treatment apparatus may be any of other various plasma etching apparatuses such as a plasma etching apparatus of an inductively coupled plasma (ICP) type. In addition, the reduced-pressure treatment apparatus need only be an apparatus for treating a wafer in a reduced-pressure condition, and may be, for example, a film forming apparatus for growth of a film on a surface of a wafer.

The plasma etching method according to the present embodiment is a method of plasma-etching an upper surface (ground surface) of a wafer W after the wafer W with a taper T attached to its surface on one side (lower surface) is subjected to grinding of its surface on the other side (upper surface) by a grinding wheel. Specifically, the plasma etching method is carried out through a drying step of drying the tape T on the lower surface of the wafer W (see FIG. 2), an electrostatic holding step of electrostatically holding the wafer W by an electrostatic chuck 4 (see FIG. 3), and an etching step of plasma-etching the ground surface of the wafer W by a reaction gas brought into a plasma state (see FIG. 3), the steps being carried out after the ground surface (surface to be ground) of the wafer W is ground while supplying grinding water.

Note that the wafer W as an object to be held in the present embodiment is a semiconductor wafer formed in a disk-like shape from silicon (Si), gallium arsenide (GaAs) or the like, and the tape T as a protective member is attached to the lower surface of the wafer W. The wafer W is not limited to the semiconductor wafer, and may be any one that can be an object to be held. For instance, the wafer W may be an optical device wafer formed from sapphire or silicon carbide. Besides, the material of the tape T is not specifically restricted. For example, the tape T is formed by applying an adhesive material to a surface of a base material, and the base material is formed from a synthetic resin such as polyurethane, polyethylene terephthalate (PET), or polyolefin.

In the present embodiment, it is assumed that the tape T is water-absorbing, though only slightly, and, due to the grinding of the surface (surface to be ground) of the wafer W while supplying grinding water to the wafer W in the preceding grinding step, a portion of the grinding water has been absorbed into the tape T.

In the first place, the drying step will be described. As illustrated in FIG. 2, the wafer W is preliminarily subjected to the drying step, before being carried into a reduced-pressure chamber C (see FIG. 3) of a plasma etching apparatus 1 by carrying means 2. The carrying means 2 is configured to hold the upper surface of the wafer W and to carry the wafer W onto an electrostatic chuck 4 (see FIG. 3) which will be described later.

The carrying means 2 is a porous chuck capable of holding the wafer W by suction and moving it to an arbitrary position, in which a holding surface 20 formed of a porous material such as a ceramic is formed at a lower surface of a disk-shaped frame body. By a negative pressure generated at the holding surface 20, the wafer W can be suction held. In addition, the carrying means 2 is configured to be movable in the vertical direction and horizontal directions by a moving mechanism 21.

In the drying step, heat is applied to the tape T to dry the tape T, whereby water present in the tape T is removed. Specifically, as depicted in FIG. 2, a heater table 3 is positioned on the lower side of the wafer W suction held by the carrying means 2. The heater table 3 is composed of a disk substantially equal to or greater than the wafer W in diameter, with a heater 30 incorporated therein over substantially the whole inside region thereof. A direct current (DC) power source 31 is connected to the heater 30. In addition, a temperature sensor 32 for detecting the temperature of the heater table 3 is provided in the disk. The heater table 3 is preliminarily heated by the heater 30; for example, the temperature of the heater table 3 is regulated in such a manner that an output value of the temperature sensor 32 is 60 degrees.

The carrying means 2 is lowered in such a manner that the lower surface of the tape T makes contact with the upper surface of the heater table 3. Then, the system is left to stand for a predetermined time (for example, one minute), whereby the tape T is heated. By this process, even in the case where grinding water has been absorbed in the tape T in the preceding grinding step, it is possible to remove the water present in the tape T, or to dry the tape T.

In this case, the tape T may be heated with the wafer W pressed against the heater table 3 by the carrying means 2, or the tape T may be heated in a state in which the suction holding of the wafer W by the carrying means 2 is released and the carrying means 2 is spaced from the wafer W. Note that in the case where the carrying means 2 is spaced from the heater table 3, the heater table 3 preferably has a configuration in which a porous plate can communicate with a suction source such as to suction hold the tape T and in which a heater is disposed in the porous plate.

In addition, the drying step is not limited to the configuration in which drying is conducted with the wafer W placed on the heater table 3, and can be modified, as required. For instance, instead of using the heater table 3, the tape T may be heated by blowing hot air toward the tape T from the lower side of the wafer W in a state in which the upper surface of the wafer W is suction held by the carrying means 2. Besides, the carrying means 2 may be provided with a heater, and the tape T is indirectly dried by heating the wafer W in a state in which the wafer W is suction held by the carrying means 2.

In addition, while details will be described later, the drying step is preferably carried out while the wafer W is subjected to plasma etching by the etching apparatus 1. By this procedure, a waiting time of the etching step can be effectively utilized, and the tact time of the steps as a whole can be shortened.

Next, the electrostatic holding step and the etching step are carried out. Here, a general configuration of the plasma etching apparatus 1 will be described. As depicted in FIG. 3, the plasma etching apparatus 1 has a housing unit 10 that partitions a predetermined reduced-pressure chamber C. The housing unit 10 is provided with an introduction port 11 for introducing a reaction gas or the like therethrough, and an exhaust port 12 for exhausting the reaction gas or the like. In the reduced-pressure chamber C, the electrostatic chuck 4 as a lower electrode unit for forming an electric field and an upper electrode unit 5 are disposed opposite to each other, with a predetermined spacing therebetween in the vertical direction.

The electrostatic chuck 4 is composed of a disk greater than the wafer W in diameter, and is provided at an upper surface with a holding surface 41 formed with a plurality of minute holes 40 (suction ports). The plurality of minute holes 40 are disposed at predetermined intervals, in a range on the inside of an outer edge of the wafer W. The plurality of minute holes 40 communicate with a common communication passage 42 inside the disk, and are connected to (communicating with) a suction source 43. With the holding surface 41 drawn by the suction source 43, a negative pressure is generated on the holding surface 41. Thus, the suction source 43, the plurality of minute holes 40 and the communication passage 42 constitute suction holding means for suction holding (tentatively holding) the wafer W.

In addition, other than the above-mentioned configuration, a pair of electrodes 44 are disposed inside the electrostatic chuck 4. The pair of electrodes 44 are embedded in the disk, ranging over substantially the whole part of the holding surface 41. The electrodes 44 are connected to a DC power source 45. DC power is applied from the DC power source 45 to the pair of electrodes 44, whereby static electricity can be generated on the holding surface 41. The pair of electrodes 44 and the DC power source 45 constitute electrostatic holding means for electrostatically attracting and holding (truly holding) the wafer W. Note that the electrodes 44 may be formed either in a single-pole structure or in a double-pole structure. Besides, the electrostatic chuck 4 is connected to a high-frequency power source 46. On the other hand, the upper electrode unit 5 has a lower surface that faces the upper surface of the wafer W. The upper electrode unit 5 is connected to an earth 51.

The carrying means 2 (see FIG. 2) is moved into the reduced-pressure chamber C with the wafer W held thereon, and the position thereof is adjusted in such a manner that the center of the holding surface 41 and the center of the wafer W coincide with each other, after which the carrying means 2 is lowered to a height at which the lower surface of the wafer W makes contact with the holding surface 41. Then, the suction holding of the wafer W (its upper surface) by the carrying means 2 is released. On the other hand, the plurality of minute holes 40 and the communication passage 42 and the suction source 43 are made to communicate with one another, and a suction force is generated on the holding surface 41 from the suction source 43, whereby the lower surface of the wafer W is suction held (tentatively held) on the holding surface 41.

In the electrostatic holding step, as depicted in FIG. 3, the suction holding of the wafer W by the suction source 43 is released, and, on the other hand, the DC power is supplied to the pair of electrodes 44 to generate static electricity on the holding surface 41, whereby the wafer W is electrostatically attracted and held, or truly held, on the holding surface 41 through the tape T.

Then, the etching step is performed. In the etching step, the pressure inside the reduced-pressure chamber C is reduced, and a reaction gas is introduced into the reduced-pressure chamber C through the introduction port 11. Since water in the tape T has been preliminarily removed in the drying step as above-mentioned, no water comes out of the tape T even when the pressure inside the reduced-pressure chamber C is reduced. Note that as the reaction gas, there is used, for example, a fluorine-containing fluorine-based stable gas such as sulfur hexafluoride ($SF_6$), methane tetrafluoride ($CF_4$), and nitrogen trifluoride ($NF_3$).

In a state in which the reaction gas is supplied in such a manner as to cover the wafer W, a high-frequency voltage is impressed between the electrostatic chuck 4 and the upper electrode unit 5, whereby the reaction gas is brought into a plasma state (is radicalized). By the reaction gas brought into the plasma state, the ground surface of the wafer W is subjected to dry etching (isotropic etching) through radical chain reactions, whereby grinding streaks are removed from the ground surface of the wafer W, and the die strength of the wafer W is enhanced. Note that a plurality of introduction ports (not depicted) may be formed in the lower surface of the upper electrode unit 5, and the reaction gas may be supplied through the upper electrode unit 5.

Tape burn can be prevented from occurring, since water in the tape T has been removed, as aforementioned. Note that during the etching step, the drying step for the wafer W scheduled to be etched next is preferably carried out. By this procedure, the time required for the etching step can be effectively utilized.

As has been described above, according to the present embodiment, even when grinding water is absorbed in the tape T due to grinding, positive heating of the tape T by the drying step makes it possible to preliminarily remove the water present in the tape T. Therefore, even upon a reduction in the pressure inside the reduced-pressure chamber at the time of the etching step, no water comes out of the tape T, and generation of a bubble between the tape T and the holding surface 41 of the electrostatic chuck 4 can be prevented. Consequently, tape burn can be prevented from occurring when plasma etching is performed.

Note that while the plasma etching apparatus has been taken as an example of the etching apparatus in describing the above embodiment, this configuration is not restrictive. The plasma etching method of the present invention may be applied to any apparatus.

In addition, each of the steps in the above embodiment merely depicts an example, and the sequence of operations of the apparatus and operations of the operator in each step can be modified, as required. Besides, each step can be carried out full-automatically, or, for example, the drying step may be manually carried out by the operator.

In addition, while the temperature of the heater table 3 has been adjusted to 60 degrees in the above embodiment, this configuration is not restrictive. The temperature of the heater table 3 can be modified as required, according to the material of the tape T or the size (of the wafer W) or the like. For example, in the case where the material of the tape T is a highly water-absorbing material or the size is comparatively large, it is preferable to elevate the set temperature of the heater table 3.

Besides, while the heating time of the tape T by the heater table 3 in the drying step has been set, for example, to one minute in the above embodiment, this is not limitative, and the heating time can be changed, as required. The heating time can also be changed as required, according to the material of the tape T or the size (of the wafer W) or the like, as above-mentioned. For instance, in the case where the material of the tape T is a highly water-absorbing material or the size is comparatively large, it is preferable to set a longer heating time for the tape T. In addition, while the embodiment and modifications have been described, whole-basis or partial combinations of the above embodiment and modifications may be used as another embodiment of the present invention.

The embodiment of the present invention is not limited to the above-described embodiment, and various changes, replacements and modifications may be made without departing from the gist of the technical thought of the invention. Furthermore, if the technical thought of the present invention can be realized in a different manner, owing to the progress of technology or by other derived technology, the present invention may be carried out by the different method. Accordingly, the claims cover all the embodiments which can fall within the scope of the technical thought of the present invention.

As has been described above, the present invention has an effect to enable prevention of tape burn, and is particularly useful for a plasma etching method.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A plasma etching method for plasma-etching a ground surface of a wafer by a plasma etching apparatus after the wafer with a tape attached to its surface on one side is subjected to grinding of its surface on an other side by a grinding wheel while supplying grinding water,
the plasma etching apparatus including an electrostatic chuck for holding the wafer through the tape by an electrostatic force generated by supplying direct current power to electrodes disposed inside, and a reduced-pressure chamber which accommodates the electrostatic chuck holding the wafer, the pressure inside which is reduced, in which a reaction gas is brought into a plasma state, and in which plasma etching of the wafer is conducted,
the plasma etching method comprising:
a drying step of applying heat to the tape to remove water present in the tape, wherein the drying step is only performed with the tape contacting an upper surface of a heater table, the heater table being a vacuum table including a porous plate in communication with a suction source, the porous plate having a heater disposed therein;
an electrostatic holding step of supplying direct current power to the electrodes of the electrostatic chuck to generate static electricity and to thereby electrostatically hold the wafer, after the drying step; and
an etching step including reducing the pressure in the reduced-pressure chamber, and plasma-etching the ground surface of the wafer held by the electrostatic chuck by the reaction gas brought into the plasma state, after the electrostatic holding step.

2. The method of claim 1, wherein the heater table is heated for about one minute.

3. The method of claim 1, wherein the heater incorporated into the heating table is provided over substantially the entire upper surface of the heating table.

4. The method of claim 1, wherein the etching step is performed on the wafer at the same time that the drying step is being performed upon a subsequent wafer scheduled to be subjected to the etching step next.

* * * * *